United States Patent

Wang et al.

[11] Patent Number: 6,080,660
[45] Date of Patent: Jun. 27, 2000

[54] VIA STRUCTURE AND METHOD OF MANUFACTURE

[75] Inventors: Kun-Chih Wang, Tucheng; Hsiao-Pang Chou, Hsinten; Wen-Yi Hsieh, Hsinchu; Tri-Rung Yew, Hsinchu Hsien, all of Taiwan

[73] Assignee: United Microelectronics Corp., Hsin-Chu, Taiwan

[21] Appl. No.: 09/032,682

[22] Filed: Feb. 27, 1998

[30] Foreign Application Priority Data

Dec. 3, 1997 [TW] Taiwan ................................ 086118144

[51] Int. Cl.⁷ .............................................. H01L 21/4763
[52] U.S. Cl. ........................... 438/637; 438/636; 438/638; 438/640; 438/672; 438/739; 257/751; 257/764; 257/770
[58] Field of Search ..................................... 438/637, 636, 438/638, 640, 668, 672, 673, 738, 739, 618, 622, 627, 677; 257/751, 764, 770

[56] References Cited

U.S. PATENT DOCUMENTS

| | | | |
|---|---|---|---|
| 3,858,231 | 12/1974 | Magdo et al. | 357/15 |
| 5,756,396 | 5/1998 | Lee et al. | 438/622 |
| 5,811,353 | 9/1998 | Nanjo | 438/666 |
| 5,827,778 | 10/1998 | Yamada | 438/637 |
| 5,888,901 | 3/1999 | Grivna | 438/637 |

*Primary Examiner*—John F. Niebling
*Assistant Examiner*—Ha Tran Nguyen

[57] ABSTRACT

A method for manufacturing a via structure comprising the steps of providing a semiconductor substrate, and then forming conductive line and dielectric layer over the substrate. Next, a photolithographic and a first etching operation are conducted so that an opening in the dielectric layer exposing the conductive line surface is formed. The first etching operation uses several etchants including fluorobutane, which has the highest concentration. Since there is a re-entrance structure at the bottom of the opening, a second etching operation is performed. In the second etching operation, a portion of the conductive line is etched for a fixed time interval to control the degree of etching. Consequently, a slanting surface is formed at the bottom of the opening and the re-entrance structure is eliminated. With a planarized bottom, step coverage of subsequently deposited material is increased.

12 Claims, 2 Drawing Sheets

VIA STRUCTURE AND METHOD OF MANUFACTURE

CROSS-REFERENCE TO RELATED APPLICATION

This application claims the priority benefit of Taiwan application serial no. 86118144, filed Dec. 3, 1997, the full disclosure of which is incorporated herein by reference.

BACKGROUND OF THE INVENTION

1. Field of Invention

The present invention relates to a via structure and its method of manufacture. More particularly, the present invention relates to a process for forming a via that can avoid the formation of re-entrances or notches when the via is not fully aligned with the metal conductive layer.

2. Description of Related Art

As the level of integration for semiconductor devices is increased, the number of metal interconnects linking the devices must correspondingly be increased. To fit all the metal interconnects on the available wafer surface, besides fabricating finer interconnects, several layers of these interconnects are now commonly employed. A via is a semiconductor structure serving as a link between different metallic layers at different height levels. When the dimensions of semiconductor devices are further shrunk, more stringent design rules are required. Consequently, the quality requirements of a via are raised. When there is re-entrances or notches in the via, interconnectivity between different metallic conductive layers will be greatly affected, leading to a lower device reliability.

FIGS. 1A and 1B are side views showing the progression of manufacturing steps for producing a conventional via structure. First, as shown in FIG. 1A, a semiconductor device 10 is provided. The semiconductor device has a metallic layer or transistors having source/drain regions and gate regions already formed thereon. The metallic layer or the transistors are represented as a device layer 11 in FIG. 1A. Next, a conductive layer 12 is formed over the device layer 11, for example, by sputtering a metallic layer or an aluminum layer, or by depositing a polysilicon layer. In general, a titanium/titanium nitride (Ti/TiN) composite layer 14, which acts as an anti-reflective coating (ARC) and an etching stop layer, is also formed over the conductive layer 12. Thereafter, photolithographic and etching processes are used to pattern the conductive layer 12 forming the structure as shown in FIG. 1A Next, as shown in FIG. 1B, an inter-metal dielectric (IMD) layer 13 is deposited over the conductive layer 12. The IMD can be, for example, a borophosphosilicate glass (BPSG) layer, a spin-on-glass (SOG) layer or similar types of material layers. Then, using photolithographic and etching processes again, a photoresist layer 15 is formed over the IMD layer 13. Thereafter, the IMD layer 13 is patterned to form openings 16 in designated locations exposing a portion of the conductive layer 12. In the subsequent step, conductive material, for example, tungsten, is deposited into the openings 16 to form via structures for electrically connecting top and bottom metallic layers. Finally, subsequent processes necessary for completing the fabrication of interconnects are conducted.

Normally, the aforementioned photolithographic and photoresist patterning procedures are not error free and can be cause slight misalignment. When subsequent etching is carried out to form the openings 16, the resulting openings are not in exact alignment with the conductive layer 12. Under these circumstances, the side of the conductive layer can be over-etched forming re-entrances or notches such as 17 in FIG. 1B. These re-entrances not only will prevent smooth deposition of the titanium/titanium nitride composite layer in a subsequent process, but will also affect the quality of subsequently deposited metal in the via and leading to poor step coverage. For example, voids can form inside the via leading to a large increase in via resistance, thereby lowering the electrical conductivity as well as the reliability of a device. In addition, the voids in the via will result in a stronger electromigration (EM). EM is a phenomenon that occurs when electrons from a metal are constantly bombarding against certain region, which after some time becomes structurally unstable. EM phenomenon is especially serious at metallic interface regions. Thus, EM is an undesirable side effects in a via structure that needs to be eliminated.

Aside from forming voids in the via, the conventional method of forming a via has some other defects as well. For example, the titanium/titanium nitride composite layer 14 that forms over the conductive layer can serve as an anti-reflection coating as well as an etching stop layer. However, the existence of a titanium/titanium nitride composite layer 14 can easily lead to a high and non-uniform via resistance due to Rv scattering. Furthermore, the layer 14 enhances the misalignment problem when a photolithographic alignment is performed. Hence, etching operation becomes more difficult to control and further miniaturization of devices is more difficult to accomplish.

In light of the foregoing, there is a need to provide an improved method for forming a via.

SUMMARY OF THE NVENTION

Accordingly, the present invention is to provide a via structure and its method of manufacture that can avoid the formation of re-entrances or notches in a via with the addition of only simple etching operations.

To achieve these and other advantages and in accordance with the purpose of the invention, as embodied and broadly described herein, the invention provides a via structure and its method of manufacture. The method comprises the steps of providing a semiconductor substrate, and then forming a conductive layer over the substrate. Next, the conductive layer is patterned to form a conductive line structure. Thereafter, a dielectric layer is formed over the conductive line. Then, a photolithographic processing is performed, followed by a first etching operation to form an opening in the dielectric layer exposing the conductive line surface. Next, a DRM etching method is used for the first etching operation, where the etchants include fluorobutane ($C_4F_8$), carbon monoxide (CO), gaseous argon and gaseous oxygen, wherein the fluorobutane has the highest concentration. The above opening is for forming a via. Moreover, the via has a re-entrance or notch structure at the bottom part of the opening. Next, a second etching operation is performed whose timing is controlled to achieve the desired degree of etching so that a portion of the conductive line surface is etched away. Consequently, a slightly slanting but planar surface is formed at the bottom of the opening. This slanting but planar surface rises gradually from the side of the opening having a re-entrance towards the opposite side, and is capable of eliminating the re-entrance structure so that the opening has a planarized bottom. Planarization at the bottom of the opening has the advantages of increasing the step coverage of subsequently deposited material.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A and 1B (Prior Art) are side views showing the progression of manufacturing steps for producing a conventional via structure.

DESCRIPTION OF THE PREFERRED EMBODIMENTS

Figure 1A:
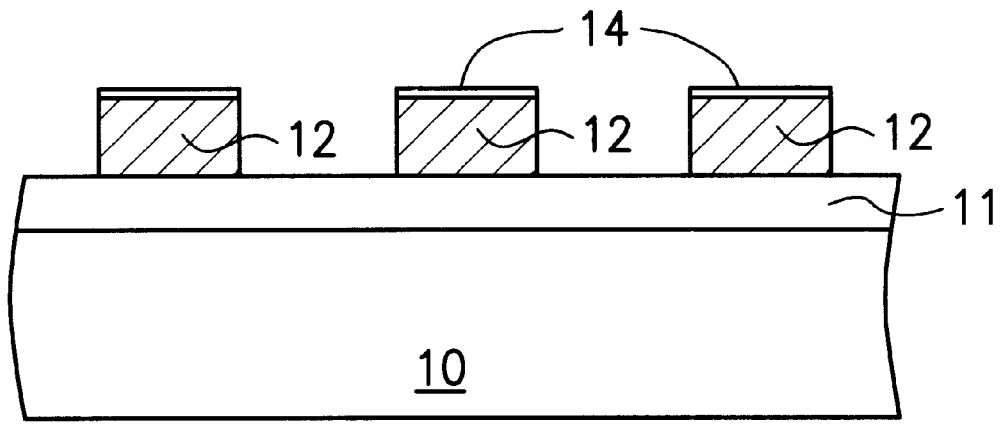
Figure 1B:
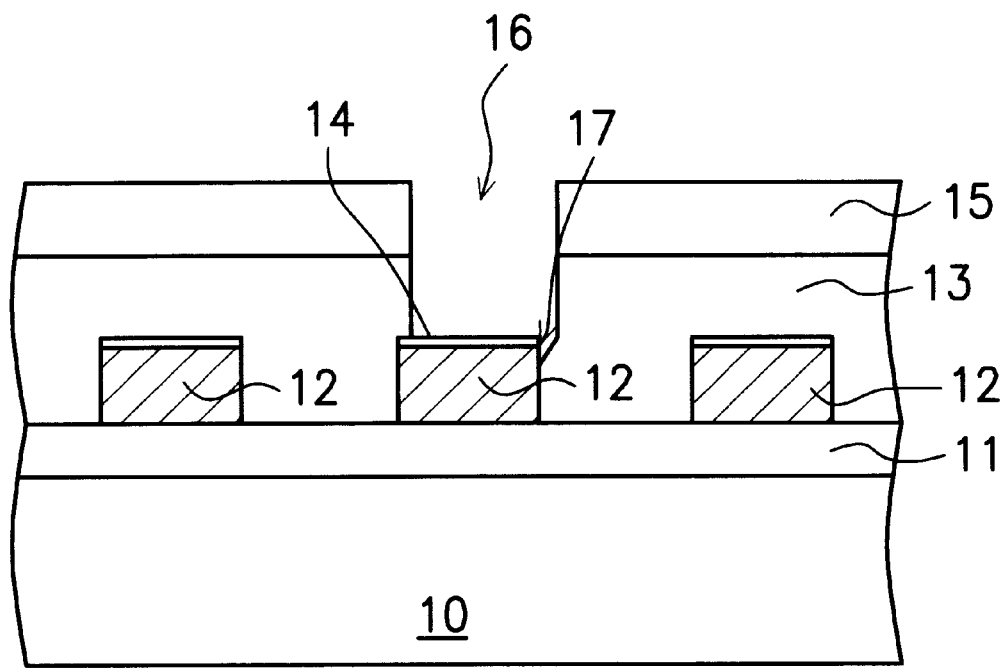

Reference will now be made in detail to the present preferred embodiments of the invention, examples of which are illustrated in the accompanying drawings. Wherever possible, the same reference numbers are used in the drawings and the description to refer to the same or like parts.

This invention utilizes two characteristic etching operations. In the first etching operation, for example, a DRM etching method is used, where the etchants include fluorobutane ($C_4F_8$), carbon monoxide (CO), gaseous argon and gaseous oxygen, wherein the fluorobutane has the highest concentration. Alternately, a DRM etching method employing etchants having a high selectivity between silicon dioxide ($SiO_2$) and titanium nitride (TiN) can be used. The first etching operation is the first characteristic of this invention. The second etching operation is for etching the conductive layer at the bottom part of the via so that a planarized bottom surface is formed. The second etching operation can be performed using, for example, an isotropic etching method whose etchants include fluorobutane ($C_4F_8$) and oxygen. The etching operation is conducted for a fixed time interval in order to control the degree of etching. Alternatively, the second etching operation can be an isotropic etching method whose etchants are capable of etching the conductive line and the titanium nitride layer simultaneously. Similarly, the etching operation is conducted for a fixed time interval in order to control the degree of etching. The slanting but planar via bottom created by the second etching operation is the second characteristic of this invention. The slightly slanting but planar bottom of the via serves to avoid the formation of re-entrances or notches in a conventionally fabricated via, thus improving the quality of the via structure.

Figure 2A:
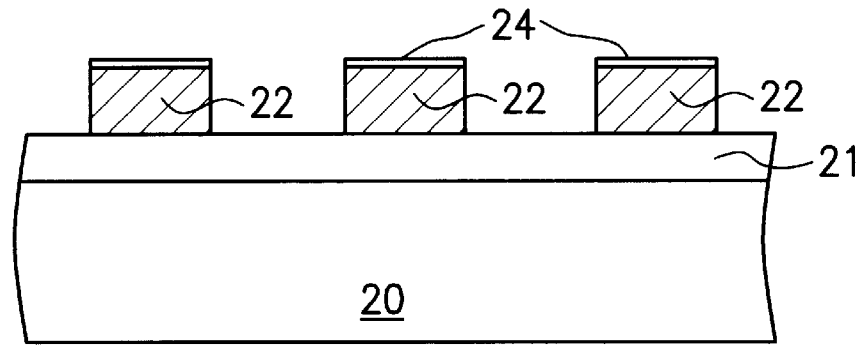
FIGS. 2A through 2C are side views showing the progression of manufacturing steps for producing a via structure according to one preferred embodiment of this invention.
Figure 2B:
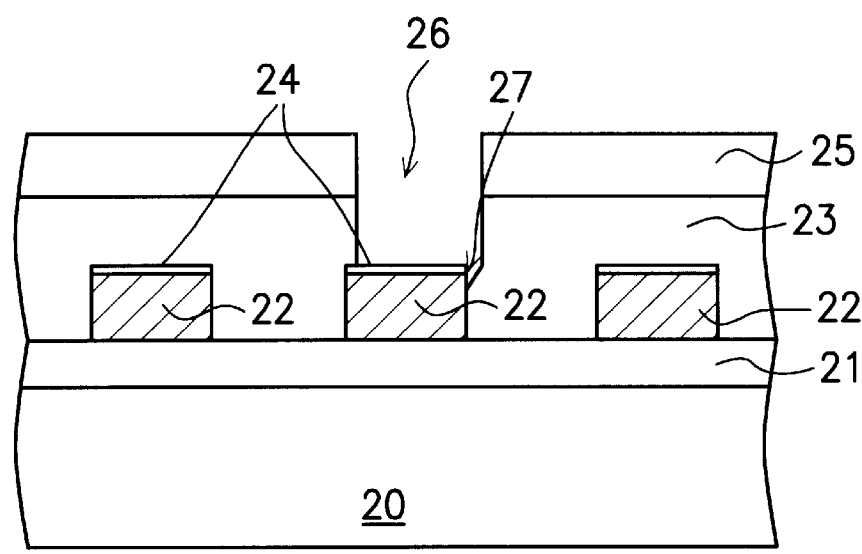
Figure 2C:
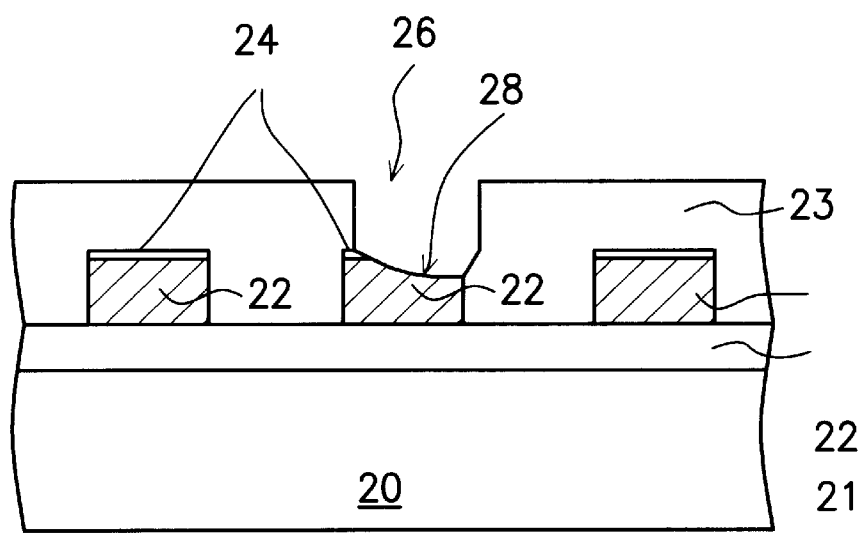

FIGS. 2A through 2C are side views showing the progression of manufacturing steps for producing a via structure according to one preferred embodiment of this invention. First, as shown in FIG. 2A, a semiconductor device 20 is provided. The semiconductor device has a metallic layer or transistors having source/drain regions and gate regions formed thereon. The metallic layer or the transistors are represented as a device layer 21 in FIG. 2A. Next, a conductive layer 22 is formed over the device layer 21, for example, by sputtering a metallic layer or an aluminum layer, or by depositing a polysilicon layer. In general, a titanium/titanium nitride (Ti/TiN) composite layer 24 or a titanium nitride layer 24, which acts as an anti-reflective coating (ARC) and an etching stop layer, is also formed over the conductive layer 22. Thereafter, photolithographic and etching processes are used to pattern the conductive layer 22 forming the structure as shown in FIG. 2A.

Next, as shown in FIG. 2B, an inter-metal dielectric (IMD) layer 23 is deposited over the conductive layer 22. The ID can be, for example, a borophosphosilicate glass (BPSG) layer, a spin-on-glass (SOG) layer or similar types of material layers. Then, using photolithographic and etching processes, a photoresist layer 25 is formed over the IMD layer 23. Thereafter, the IMD layer 23 is patterned and then a first etching operation is conducted to form openings 26 in designated locations exposing a portion of the conductive layer 22. The openings 26 can be formed, for example, by a DRM etching method, where the etchants include fluorobutane ($C_4F_8$), carbon monoxide (CO), gaseous argon and gaseous oxygen, wherein the fluorobutane has the highest concentration. Alternately, a DRM etching method employing etchants having a high selectivity between silicon dioxide (SiO2) and titanium nitride (TiN) can be used. ! This first etching operation is the first characteristic of this invention.

Next, as shown in FIG. 2C, a second etching operation is conducted to remove the titanium/titanium nitride composite layer 24 and a portion of the conductive line 22 at the top. The second etching is conducted for a fixed time interval to control the degree of etching. Finally, a slightly slanting planar surface 28 is obtained. The second etching operation can be performed using, for example, an isotropic etching method whose etchants include fluorobutane ($C_4F_8$) and oxygen. Alternatively, the second etching operation can be an isotropic etching method whose etchants are capable of etching the conductive line 22 and the titanium nitride layer 24 simultaneously. Similarly, the etching operation is conducted for a fixed time interval in order to control the degree of etching. The slanting but planar via bottom 28 created by the second etching operation is the second characteristic of this invention. This slanting but planar surface rises gradually from the side of the opening 26 having a re-entrance 27 towards the opposite side (as shown in FIG. 2C). Consequently, the re-entrance structure 27 is eliminated and the opening 26 has a planarized bottom. This has the advantages of increasing the step coverage of subsequently deposited material. In the subsequent step, conductive material, for example, tungsten, is deposited into the openings 26 to form via structures for electrically connecting top and bottom metallic layers. Finally, subsequent processes necessary for completing the fabrication of interconnects are conducted.

As a summary, the via structure and method of manufacture according to this invention has the following advantages:

(1) The via structure in this invention is free from re-entrance or notch Therefore, the via structure is capable of avoiding the conventional electromigration (EM) issue.

(2) The bottom part of the opening 26 has a planarized surface. Therefore, step coverage of the subsequently deposited material is increased.

(3) The titanium/titanium nitride layer 24 at the bottom of the opening 26 above the conductive layer 22 is removed in the second etching operation. Therefore, resistance of the via structure is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a via comprising:

providing a semiconductor substrate having a device layer formed thereon;

forming a conductive layer over the semiconductor substrate, wherein the conductive layer is electrically connected to the device layer, and then patterning the conductive layer to form a conductive line;

forming a dielectric layer over the conductive line;

performing a photolithographic operation and a first etching operation to form an opening in the dielectric layer exposing the conductive line surface, wherein the opening is for forming the via, and that the bottom of the opening has a re-entrance structure; and performing a second etching operation by etching a portion of the conductive line to form a slanting planar surface at the bottom of the opening so that the reentrance structure is eliminated and the bottom of the opening planarized, and hence step coverage of the subsequently deposited material is increased.

2. The method of claim 1, wherein the device layer includes a metallic layer.

3. The method of claim 1, wherein the device layer includes a structure with transistors in it.

4. The method of claim 1, wherein the step of forming the slating surface includes etching to form a surface at the bottom of the opening that rises from the side having a re-entrance structure towards the opposite side.

5. The method of claim 1, wherein the conductive line has a titanium nitride (TiN) layer formed thereon acting as an anti-reflective coating and an etching stop layer.

6. The method of claim 1, wherein the conductive line has a titanium/titanium nitride (Ti/TiN) composite layer formed thereon acting as an anti-reflective coating and an etching stop layer.

7. The method of claim 4, wherein the step of performing the first etching operation includes a DRM etching method whose etchants comprise fluorobutane ($C_4F_8$), carbon monoxide (CO), gaseous argon and gaseous oxygen.

8. The method of claim 7, wherein the step of performing the first etching operation includes a DRM etching method whose etchant concentration is higher for fluorobutane ($C_4F_8$) than carbon monoxide (CO), gaseous argon and gaseous oxygen.

9. The method of claim 1, wherein the step of performing the first etching operation includes a DRM etching method whose etchants have a high etching selectivity between silicon dioxide ($SiO_2$) and titanium nitride (TiN).

10. The method of claim 1, wherein the step of performing the second etching operation includes an isotropic etching method whose etchants comprise fluorobutane ($C_4F_8$) and oxygen.

11. The method of claim 1, wherein the step of performing the second etching operation includes an isotropic etching method conducted for a fixed interval of time to control the degree of etching.

12. The method of claim 1, wherein the step of performing the second etching operation includes an isotropic etching method whose etchants are capable of etching the conductive line and the titanium nitride layer simultaneously.

* * * * *